US012614649B2

(12) United States Patent
Iversen

(10) Patent No.: US 12,614,649 B2
(45) Date of Patent: Apr. 28, 2026

(54) INTERNAL COOLING OF POWER CABLES AND POWER UMBILICALS

(71) Applicant: NEXANS, Courbevoie (FR)

(72) Inventor: Oyvind Iversen, Ski (NO)

(73) Assignee: NEXANS, Courbevoie (FR)

( * ) Notice: Subject to any disclaimer, the term of this patent is extended or adjusted under 35 U.S.C. 154(b) by 109 days.

(21) Appl. No.: 18/231,240

(22) Filed: Aug. 7, 2023

(65) Prior Publication Data

US 2024/0071649 A1 Feb. 29, 2024

(30) Foreign Application Priority Data

Aug. 12, 2022 (EP) ..................................... 22306222

(51) Int. Cl.
| | |
|---|---|
| *H01B 7/42* | (2006.01) |
| *H01B 7/04* | (2006.01) |
| *H01B 7/20* | (2006.01) |
| *H01B 9/00* | (2006.01) |
| *H05K 7/20* | (2006.01) |

(52) U.S. Cl.
CPC ............. *H01B 7/423* (2013.01); *H01B 9/006* (2013.01); *H05K 7/20281* (2013.01)

(58) Field of Classification Search
CPC ........... H01B 7/14; H01B 7/423; H01B 9/005
See application file for complete search history.

(56) References Cited

U.S. PATENT DOCUMENTS

| | | | |
|---|---|---|---|
| 2,419,053 A | 4/1947 | Bennett | |
| 3,429,979 A | 2/1969 | Davey | |
| 6,417,457 B1 | 7/2002 | Aasbo et al. | |
| 9,368,257 B2 | 6/2016 | Karlsen et al. | |
| 10,872,713 B1 * | 12/2020 | Hobson .................... | H02G 3/03 |
| 2012/0082422 A1 | 4/2012 | Sarchi et al. | |
| 2014/0332247 A1 * | 11/2014 | Karlsen .................. | H01B 7/423 |
| | | | 174/15.6 |
| 2016/0225489 A1 * | 8/2016 | Willemoës .............. | G01L 1/246 |
| 2018/0190410 A1 * | 7/2018 | Cao ........................ | H01B 9/006 |
| 2022/0410743 A1 * | 12/2022 | Choi ....................... | B60L 53/18 |

FOREIGN PATENT DOCUMENTS

| | | | | |
|---|---|---|---|---|
| CN | 113 450 961 | | 9/2021 | |
| CN | 113 889 302 | | 1/2022 | |
| EP | 2321685 B1 | | 6/2017 | |
| EP | 4322181 A1 | | 2/2024 | |
| KR | 100401593 B1 | * | 10/2003 | ............. G01R 31/58 |

OTHER PUBLICATIONS

European Search Report dated Jan. 19, 2023.
European Patent Office Third Party Observation for corresponding application EP20220306222; Report dated Jun. 30, 2025, 9 pages.
Rochat Etienne et al., "Long power cables: exposing incipient faults and optimizing performance using extra-long fibre optic distributed temperature monitoring", 9th International Conference on Insulated Power Cables, (JUn. 25, 2015), pp. 1-7.

* cited by examiner

*Primary Examiner* — Timothy J Thompson
*Assistant Examiner* — Amol H Patel
(74) *Attorney, Agent, or Firm* — CANTOR COLBURN LLP

(57) ABSTRACT

A power cable has an outer sheath, at least one conductor element arranged within the outer sheath and a filler element arranged within the outer sheath. The filler element is hollow such that a cooling fluid can be passed through the filler element. A temperature sensor is configured to measure the internal temperature of the cable.

14 Claims, 6 Drawing Sheets

INTERNAL COOLING OF POWER CABLES AND POWER UMBILICALS

RELATED APPLICATION

This application claims the benefit of priority from European Patent Application No. 22 306 222.5, filed on Aug. 12, 2022, the entirety of which is incorporated by reference.

FIELD OF THE INVENTION

The present invention relates to a power cable in need of internal cooling.

BACKGROUND

The transfer of electrical power through a power cable results in generation of heat within the cable. The present invention relates to transfer of heat caused by the electrical power away from the insulating-, semi conductive- and protective layers surrounding the power conductor(s) in a cable (power cable or power umbilical). A special problem area is power cables arranged inside guide tubes at platforms or other installations above sea level where the guide tube may be filled with air. A similar challenge may also occur when the filling is of water instead of air. This section represents a thermal bottleneck and is often the dimensioning factor for the whole cable length. Bend stiffeners are another known thermal bottleneck independently if arranged above or below the sea surface.

To control the temperature of the power cable or power umbilical external or internal cooling may be employed.

U.S. Pat. No. 6,417,457 discloses a single conductor cable for a subsea pipeline heating system. The cable comprises internal grooves or gaps filled with water. The water enhances cooling especially if circulated through the cable.

U.S. Pat. No. 3,429,979 discloses forced flow of cooling liquid through a hollow conductor and passages within a high voltage cable. The hollow conductor and the passages are connected such that the cooling medium flows in parallel and periodically changes between flowing through the core and through the outer passages. The outer passages can be cooled by the surroundings or a second cooling fluid such as water or air retained by placing the cable within an outer tube. The water may be discharged after having been passed along the cable or it may be recycled or cooled and reused.

U.S. Pat. No. 2,419,053 discloses a cable with a continuous hollow core through which water can be passed for cooling. The cable is adapted to be floating in the sea.

U.S. Pat. No. 9,368,257 discloses a power cable with continuous hollow filler elements such that a cooling fluid can be passed through the filler elements. In an embodiment, the power cable comprises at least two hollow filler elements and a recycling section. Here the cooling fluid can be passed through a first hollow filler element to the recycling section and passed from the recycling section through the second hollow filler.

The prior art solutions provide flow passages for cooling water by increasing the cross-sectional diameter of the cable. Either by employing a hollow core, which increases the diameter of the core and thereby the cable, as the cross sectional area of the core material must be equivalent for allowing the same electrical power supply; or by including a passage for cooling water, where the adding of the passage increases the cross sectional area by the cross sectional area of the passage.

SUMMARY OF THE INVENTION

The present invention is defined by the appended claims and in the following:

In a first aspect, the invention relates to a power cable comprising:
- an outer sheath;
- at least one conductor element arranged within the outer sheath;
- at least one filler element arranged within the outer sheath; wherein the filler element is hollow such that a cooling fluid can be passed through the filler element; and
- a temperature sensor, configured to measure the internal temperature of the cable.

In an embodiment, the power cable may be a power umbilical cable.

In an embodiment, the power cable may be of wet design.

In an embodiment, the power cable may be a dynamic power cable, especially a dynamic power cable in a bend stiffener an I-tube, or a J-tube or in a tube with bell-mouth/trumpet at the end.

In an embodiment, the power cable may be a static power cable, especially placed in a horizontal directional drilling (HDD) construction, or in a section with burial or low water levels.

In an embodiment, the power cable may comprise one, two, three, four, five or six conductor elements.

In an embodiment the outer sheath may be made of polyethylene or any other suitable material.

In an embodiment, the temperature sensor may be configured to measure the internal temperature of the cable at a plurality of positions along the length of the cable.

In an embodiment of the power cable, the temperature sensor may be a fibre optic cable.

In an embodiment, the fibre optic cable may be covered by a semiconductive layer.

In an embodiment, the power cable may further comprise a metal water barrier around the insulation system.

In an embodiment of the power cable, the temperature sensor may be in direct contact with the isolation system of at least a conductor element or its sheath. Here the closer the temperature sensor is to the at least one conductor, the more accurate the temperature reading of the inner temperature of the cable will be. So a position closest possible to the at least one conductor may be desirable.

In an embodiment, the temperature sensor may be a series of analogue sensors.

In an embodiment the cooling fluid may be a cooling liquid.

In an embodiment the cooling fluid may be water, preferably sea water or fresh water. An advantage of these liquid is that they can be just let out in the water or air without filter, cleaning or need for closed loop, without risk to the environment.

In an embodiment the cooling fluid may be a cooling gas.

In an embodiment the cooling fluid may be air. An advantage of air is that it can be just let out in the water or air without filter, cleaning or need for closed loop, without risk to the environment.

In an embodiment the cooling fluid may have a thermal conductivity, higher than 0.10 W/(m*K), higher than 0.15 W/(m*K), higher than 0.20 W/(m*K), higher than 0.30 W/(m*K), higher than 0.40 W/(m*K), higher than 0.50 W/(m*K), higher than 0.60 W/(m*K) or higher than 1.00 W/(m*K).

In an embodiment the cooling fluid may be a liquid with a higher thermal conductivity than sea water.

In an embodiment, the filler element may be made of steel, plastics or a composite material.

In an embodiment, the filler element may be made of a material having a thermal conductivity of at least 0.2 W/(m\*K), at least 0.5 W/(m\*K), at least 1.0 W/(m\*K), at least 5.0 W/(m\*K), at least 10.0 W/(m\*K), at least 14.0 W/(m\*K), at least 20.0 W/(m\*K), at least 30.0 W/(m\*K), at least 40.0 W/(m\*K), at least 45.0 W/(m\*K) or at least 50.0 W/(m\*K).

In an embodiment, the cooling fluid passes through an open loop. In other words, cooling fluid is injected at an end of the cable, passes through the cable and comes out at the other end of the cable.

In an embodiment, the cooling fluid is comprised in a closed loop.

In an embodiment, the cable may have a common recycling section that includes a common fluid passage that brings an interior of at least two forward hollow filler elements in fluid communication with an interior of at least two return hollow filler elements.

In an embodiment, the recycling section may have a deflector configured to maintain an even fluid passage and prevent fluid vortexes.

In an embodiment, the recycling section may be arranged inside the outer sheath of the power cable, so that the outer diameter running the length of the power cable remains unchanged at said recycling section.

In an embodiment, the recycling section is arranged at an end of the power cable, in a manner that allows the power cable to be jointed to a second power cable. Here the recycling section may be arranged inside the outer sheath of the cable so that the outer diameter running the length of said cable remains unchanged at said recycling section, or in a housing arranged outside the outer sheath of the cable.

In a second aspect the invention relates to a power cable system, comprising the power cable according to the first aspect of the invention, and a control unit, configured to control the inner temperature of the cable, by receiving data from the temperature sensor and adapting the temperature of the cooling fluid and/or the flow of the cooling fluid and/or the power in the conductor.

In an embodiment, the cooling fluid has no flow until the inner temperature of the power cable reaches or exceeds a threshold value. In other words, the power cable is cooled by passive convection in the cooling fluid until the inner temperature of the cable reaches or exceeds a threshold value.

In an embodiment, the cooling fluid has a constant flow until the inner temperature of the power cable reaches or exceeds a threshold value. In other words, the power cable is cooled by active circulation of the cooling fluid. In other words, the cable is cooled by active convection of the cooling fluid and when the inner temperature of the cable reaches or exceeds a threshold value the flow of the cooling fluid is increased.

In an embodiment of the second aspect, the control unit may be configured to lower the temperature of the cooling fluid in the cable when the inner temperature of the power cable reaches or exceeds a threshold value. This may be achieved by replacing the cooling fluid in the cable, by increasing the flow of fluid, by refrigerating the fluid or any other means.

In an embodiment, the control unit may be configured to increase the flow of the cooling fluid when the inner temperature of the power cable reaches or exceeds a threshold value.

In an embodiment, the control unit is configured to reduce the power in the conductor when the inner temperature of the power cable reaches or exceeds a threshold value.

In an embodiment, the power cable system may further comprise a pump for regulating the flow of the cooling fluid.

In an embodiment, the power cable system may further comprise a cooling system for regulating the temperature of the cooling fluid before entry in the cable.

In a third aspect the invention relates to a dynamic power generating system, comprising a power cable system according to the second aspect of the invention and a dynamic power generator.

In an embodiment of the third aspect, the dynamic power generator is a windmill, especially an offshore windmill.

In an embodiment the dynamic power generating system is a wind farm.

SHORT DESCRIPTION OF THE DRAWINGS

In the following description this invention will be further explained by way of exemplary embodiments shown in the drawings.

DETAILED DESCRIPTION OF THE INVENTION

The present invention will be discussed in further detail with reference to the enclosed drawings. It should be noted that the drawings illustrate a number of possible embodiments, but that the present invention may be utilized in a number of power cable designs including power umbilicals and that the drawings are only schematic illustrations showing examples of such cables.

High voltage cable technology is evolving towards cables comprising conductors and insulation systems having the capacity to accommodate higher and higher power. The higher power may increase the inner temperature of cable since the transmitted current increases. Multiple solutions exist for reducing the inner temperature of the cable, often relying on passive convection. Thus, when designing cables, input data uncertainties must be combined with expected local thermal bottle neck which often results in an unnecessary large cross section for the cable.

This is especially true for offshore wind farms, where cables have to be designed to accommodate for the maximum load, which seldom occurs, and this maximum load needs to be combined with worst case (external) operating conditions.

This may result in an unnecessary large cross section of the cable due to a very local thermal bottle neck, a too expensive product or a not technically viable project (because of this constraint).

The current invention intends to improve on the internal active or passive cooling of the cable, with the feature of linking the cooling to the internal temperature control/ monitoring. In other words, the inner temperature of the cable is measured and then used for information. This allows in turn, to adjust the operation of the cable: for example, by starting active cooling, or by limiting the power (current) to be transmitted through the conductor.

Figure 1:
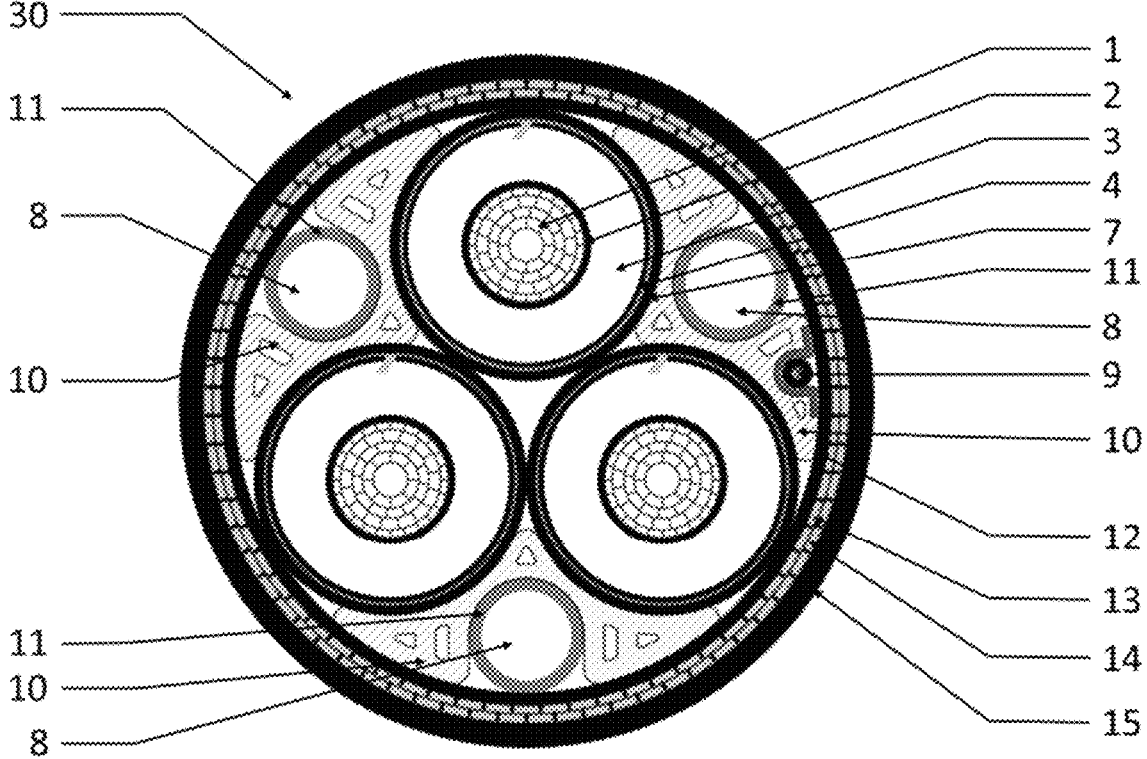
FIG. 1 is a cross-section of an embodiment of the power cable.

FIG. 1 illustrates schematically a cross sectional view through a power cable 30. The cable comprises three conductors 1. The purpose of the conductor elements is to transfer electrical power. The conductor elements can be solid conductors or comprise a plurality of conductor elements stranded together. Each conductor is surrounded by an insulation system 2,3,4 typically comprising an inner semiconducting layer 2, an electrical insulating layer 3 and outer semiconducting layer 4. Each insulation system 2,3,4 is further surrounded by an outer conductor sheath 7.

The cable further comprises a fibre optic cable 9 that may be used as an analog temperature sensor or a series of analog temperature sensors, a plurality of filler elements 10 and a plurality hollow filler elements 11.

All these elements 1,2,3,4,7,9,10,11 are surrounded by a bedding tape 12, two layers of armouring 13,14 and an outer sheath 15 made of polyethylene.

The plurality of hollow filler elements are filled with a cooling fluid 8, here sea water.

As illustrated here the different types of filler elements may be used within the same cable but it should be appreciated that the design of the filler elements can be freely selected and combined in any applicable way.

The cable is not constrained thermically on its full length, usually thermal bottlenecks appear on less than 1% of the length of the cable. As such, the cable of interest may be combined with other types of cable, since the structure and drift of the inventive cable is more complex, and thus more expensive than usual cable.

Thermal bottlenecks are places where heat accumulates in the cable, for example because it cannot release heat to the surrounding area, for example a bend stiffener, a bellmouth, an I-tube etc.

Figure 2A:
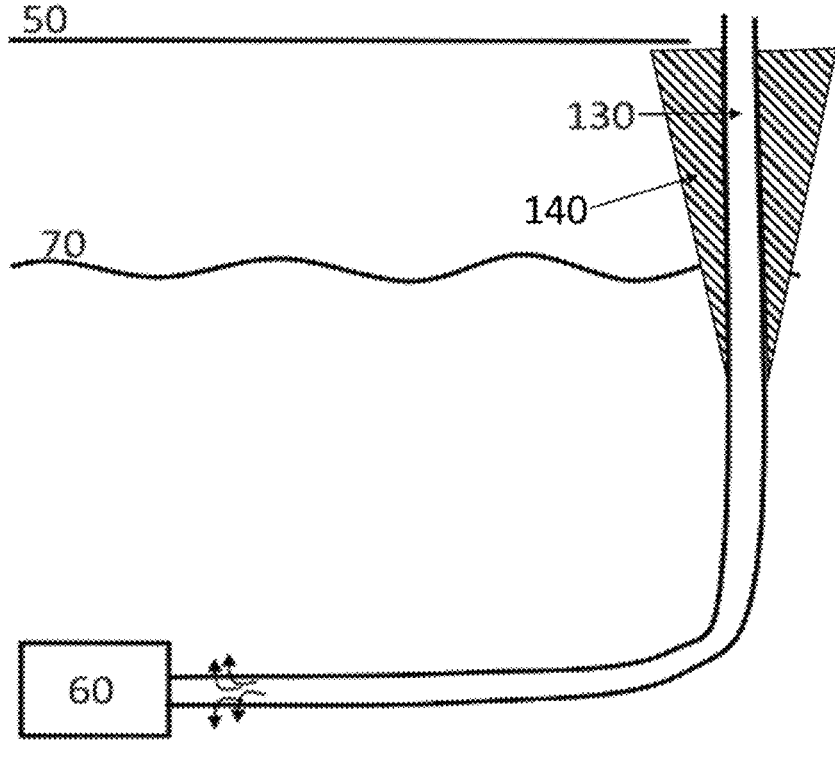
FIG. 2a is a schematic illustration of a first embodiment of the present invention.

FIG. 2a illustrates a possible arrangement of the cable when in use. The cable 130 is arranged from a platform or floating unit 50 through the sea surface 70 down to a subsea installation 60. A cooling fluid is supplied to one or more of the hollow filler elements (see FIG. 2b) within the cable 130 at the level of the platform 50. The cooling fluid passes through the cable all the way down to the subsea level. The temperature is measured using a temperature sensor (see FIG. 2b). This would typically be relevant because the cable goes through a bend stiffener 140 or an I-tube (not illustrated). Before the cable is connected to the subsea unit 60 openings through the surface of the cable are provided. These openings are in fluid communication with the interior of the hollow filler elements through which cooling fluid is passed and accordingly the cooling fluid is released to the sea subsea as indicated by the arrows. In the illustrated embodiment the cooling fluid is environmentally friendly so that it may be released to sea. The cooling fluid could for instance be sea water. In this embodiment cooling is provided both in the section of the cable where there is a thermal bottleneck, i.e. the bend stiffener 140 and in the rest of cable.

Figure 2B:
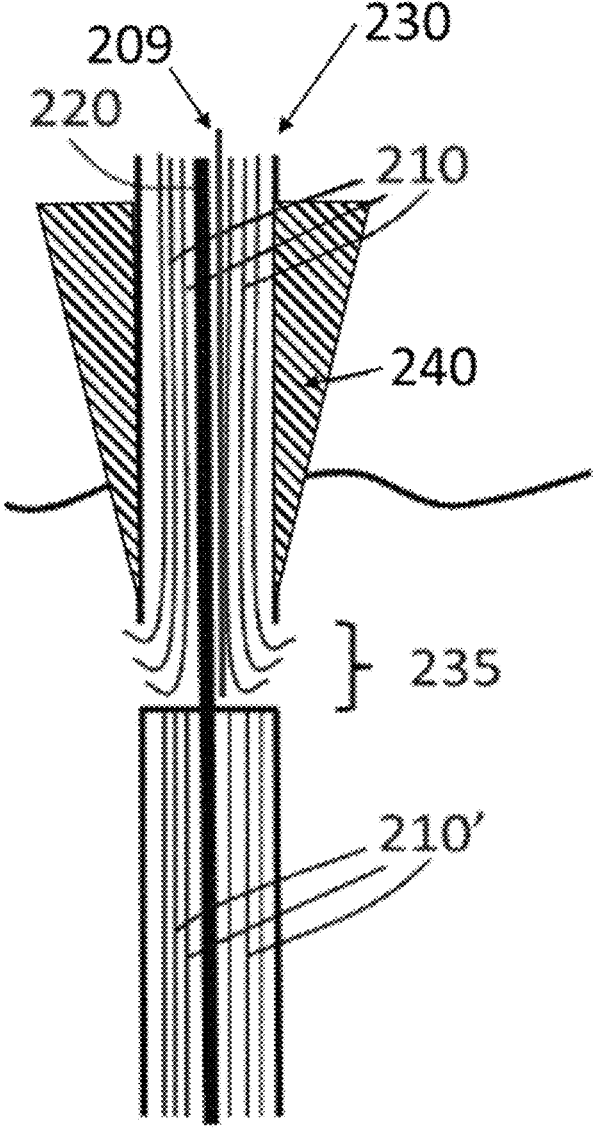
FIG. 2b illustrates an embodiment of the present invention in further detail.

FIG. 2b illustrates in further details an embodiment of the present invention. Here the cable 230 comprises a number of hollow filler elements 210, a temperature sensor 209 or a series of analog temperature sensors and at least one conductor element 220. In this figure and the following figures only one conductor element is illustrated to simplify the drawings; however each cable may comprise additional conductor elements, or signal or fluid transferring elements as well as solid filler elements. Cooling fluid enters the hollow filler elements at the platform level 50 and provides cooling of the cable and the conductor element until a section 235 of the cable arranged after the thermal bottleneck, here a bend stiffener 240. In the section 235 the interior of the hollow fillers containing cooling fluid are brought in fluid contact with the surrounding sea thereby releasing the cooling fluid to sea. The cooling fluid is accordingly not directly reused, but the cooling fluid could in one embodiment be seawater, preferably taken from a depth where it naturally has a temperature applicable for cooling the cable, especially in the section in the bend stiffener 240 (the thermal bottleneck). In the section of the cable below section 235 the filler elements 210' are not employed for cooling purposes but serve their normal purpose of filler elements.

Figure 3A:
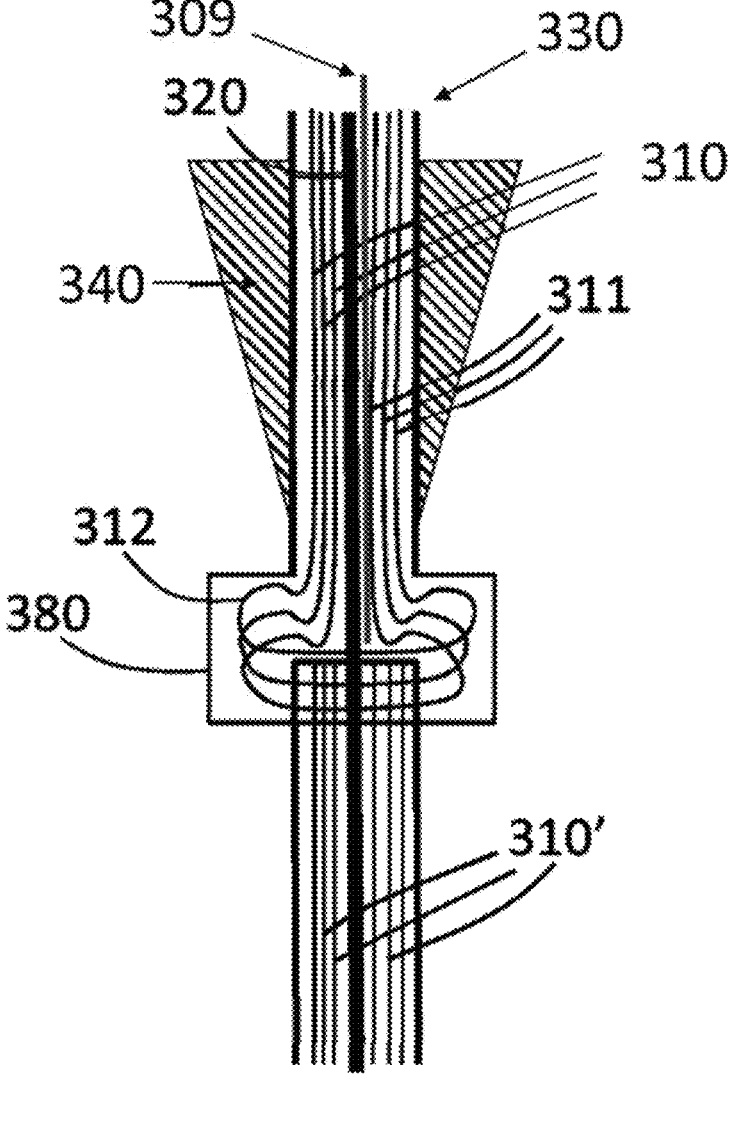
FIG. 3a illustrates schematically an embodiment with recycling of cooling fluid through the filler elements.

FIG. 3a illustrates an embodiment of the present invention comprising recycling of cooling fluid. The section of the cable 330 arranged in the bend stiffener 340 comprises at least one conductor element 320, a temperature sensor 309 or a series of analog temperature sensors and first and second hollow filler elements 310 and 311. Below the bend stiffener 340 a recycling section 380 is arranged comprising recycle loops 312 bringing the interior of a first hollow filler element 310 in fluid communication with the interior of a second hollow filler element 311 thereby allowing for cooling fluid to be passed from the top through a first hollow filler 310 through a recycle loop 312 and back to the top through the second hollow filler element 311. In this embodiment the cooling fluid is recycled back to the platform of floating unit arranged above sea level where the cooling fluid can be cooled for reuse. Any type of cooling fluid can be used as the cooling fluid is kept in a closed loop and not released to the environment. Below the recycling section 380 the filler elements 310' serve their normal purpose as filler elements.

Figure 3B:
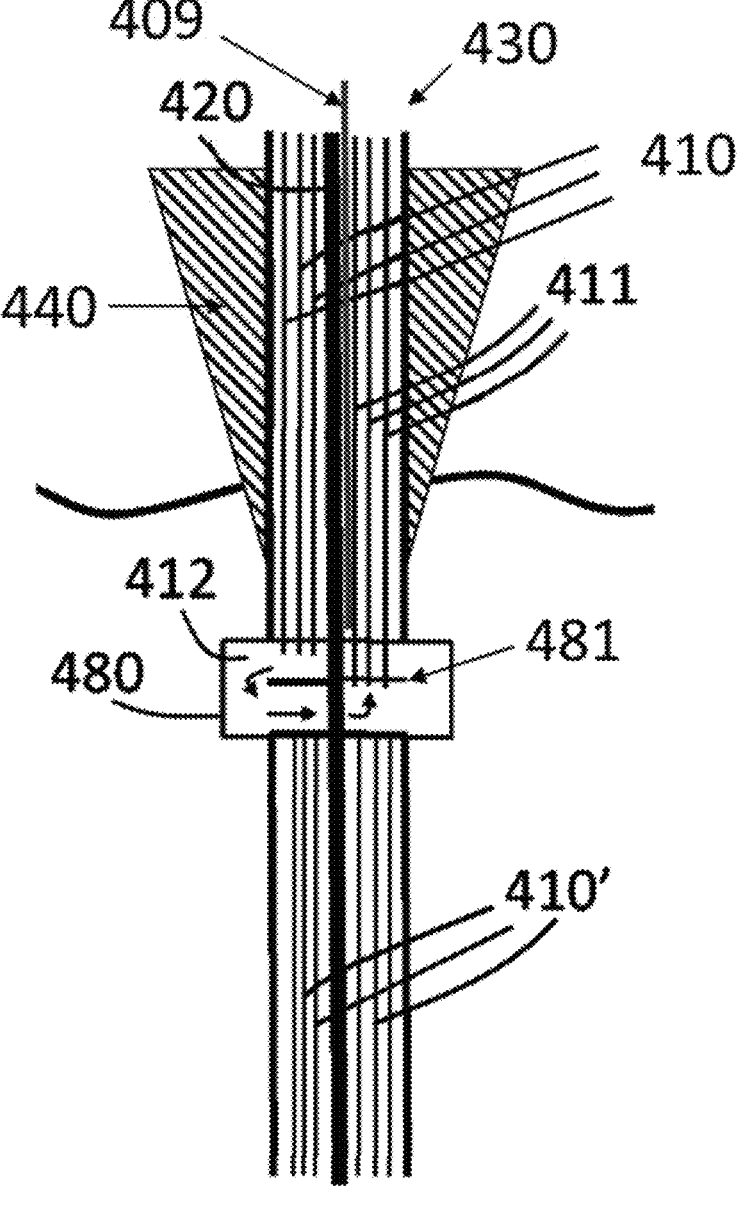
FIG. 3b illustrates an alternative arrangement with recycling of cooling fluid through the filler elements.

FIG. 3b illustrates another embodiment of the present invention comprising recycling of cooling fluid. The cable 430 comprises a conductor element 420, a temperature sensor 409 or a series of analog temperature sensors and first hollow filler elements 410 and second filler elements 411. Further the cable comprises a recycling section 480 with a deflector 481 comprising a fluid passage 412 bringing the interior of the first hollow filler elements 410 in fluid communication with the interior of the second hollow filler elements 411. The recycling section 480 is situated below the bend stiffener 440. Below the recycling section 480 the filler elements 410' serve their normal purpose as filler elements.

The recycling section could in one embodiment thereof be arranged inside the outer shell of the cable, so that the outer diameter is kept unchanged. The fluid passage could be provided during production of the cable and could include connecting hollow filler elements arranged side by side within the cable or connecting two passages arranged within the same filler element.

Figure 3C:
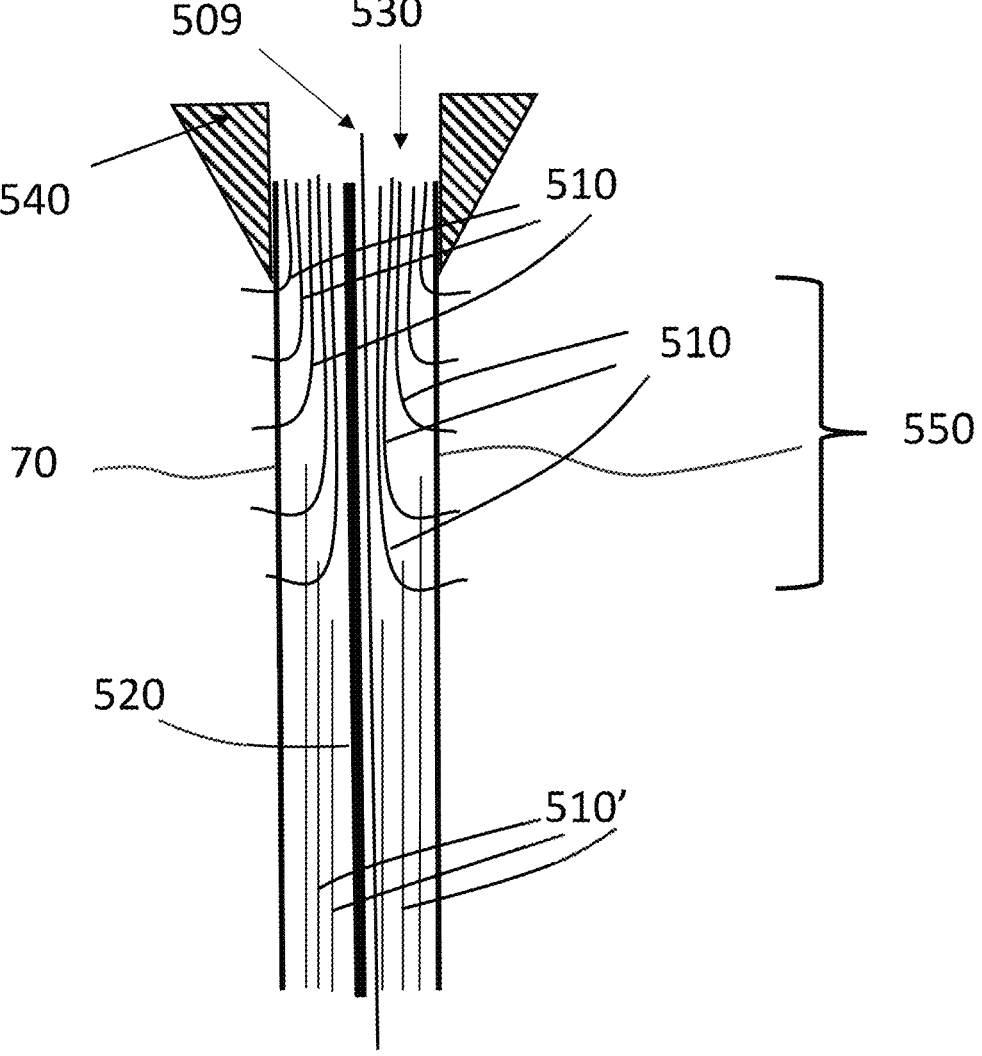
FIG. 3c illustrates schematically an embodiment with a perforated section where the hollow inside of the filler elements are brought in contact with the exterior of the power cable.

FIG. 3c illustrates a further embodiment of the present invention comprising a cable 530 with a conductor element 520, a temperature sensor 509 or a series of analog temperature sensors and hollow filler elements 510. In this embodiment the cable 530 is perforated over a section 540. This section is arranged after the bend stiffener 540 and may as illustrated be arranged near the sea level 70, or be arranged partly or fully below sea level 70 or partly or fully above sea level 70. The perforations are arranged such that fluid communication with the interior of one or more filler elements and the exterior of the cable 530 is established. Cooling fluid entering through the top will exit through the corresponding perforation. Cooling fluid exiting perforations arranged above sea level 70 will travel along the exterior surface of the cable until it reaches sea level and thereby continue to provide cooling to the cable. The cooling fluid is released to the sea and therefore should be an environmental cooling fluid such as water. Below the perforated section the filler elements 510' serve the normal purpose of filler elements.

In a power cable system and/or a dynamic power generating system, comprising the a cable comprising an outer sheath; at least one conductor element arranged within the outer sheath; a cooling fluid; a filler element arranged within the outer sheath; wherein the filler element is hollow such that a cooling fluid can be passed through the filler elements; and a temperature sensor, configured to measure the internal temperature of the cable, and a control unit, configured to control the inner temperature of the cable, by receiving data from the temperature sensor and adapting the temperature of the cooling fluid and/or the flow of the cooling fluid and/or the power in the conductor, an operator can set a threshold value in advance that the cable should not exceed, for example because exceeding this temperature may damage the cable. The control unit can then reduce, for a time, the power in the conductor, which would result in a reduction of the temperature in the thermal bottleneck. Instead or in addition, when the power cable system and/or a dynamic power generating system comprises a pump and/or a cooling system, the control unit may regulate, here increase, the flow of the cooling fluid, to reduce the temperature in the cable or may regulate the temperature of the cooling fluid to be pumped in the cable, by activating the cooling system.

The cooling system, for example a cooling tank, is especially efficient in combination with a pump in a closed loop, as it allows for good control of the temperature and speed, as well as quality, of the cooling fluid.

It is sometimes also advantageous to have sea water as the cooling fluid, as part of an open loop, the pump injecting sea water in the cable. This open loop is environmentally friendly and by getting sea water at different depth it is possible to regulate the temperature of the cooling fluid.

This combination of features is particularly advantageous compared to known solutions, because the active monitoring of the temperature of the cable (whether for a section of the cable or the full length of the cable), combined with an automated or partially automated system that allows for the control of the temperature of the cable will drastically improve the lifespan of the cable and reduce the need for repairs on the cable.

The invention claimed is:

1. A power cable system comprising:
a power cable and
a control unit,
the power cable comprising:
an outer sheath;

at least one conductor element arranged within the outer sheath;
at least one filler element arranged within the outer sheath; wherein the filler element is hollow such that a cooling fluid can be passed through the filler element; and
a temperature sensor, configured to measure the internal temperature of the power cable,
wherein the control unit is configured to control the inner temperature of the power cable, by receiving data from the temperature sensor and adapting the temperature of the cooling fluid, and wherein the power cable system further comprises:
a cooling system for regulating the temperature of the cooling fluid before entry into the cable.

2. The power cable system according to claim 1, wherein the temperature sensor is a fibre optic cable.

3. The power cable system according to claim 1, wherein the temperature sensor is a series of analogue sensors.

4. The power cable system according to claim 1, wherein the filler element is made of material having a thermal conductivity of at least 14 W/(m*K).

5. The power cable system according to claim 1, wherein the temperature sensor is configured to measure the internal temperature of the cable at a plurality of positions along the length of the cable.

6. The power cable system according to claim 1, wherein the cable has a common recycling section that includes a common fluid passage that brings an interior of at least two forward hollow filler elements in fluid communication with an interior of at least two return hollow filler elements.

7. The power cable system according to claim 6, wherein the recycling section has a deflector configured to maintain an even fluid passage and prevent fluid vortexes.

8. The power cable system according to claim 6, wherein the recycling section is arranged inside the outer sheath of the power cable, so that the outer diameter running the length of the power cable remains unchanged at said recycling section.

9. The power cable system according to claim 1, wherein the control unit is configured to lower the temperature of the cooling fluid in the power cable when the inner temperature of the cable reaches or exceeds a threshold value.

10. The power cable system according to claim 1, wherein the control unit is configured to increase the flow of the cooling fluid when the inner temperature of the power cable reaches or exceeds a threshold value.

11. The power cable system according to claim 1, wherein the control unit is configured to reduce the power in the at least one conductor element when the inner temperature of the power cable reaches or exceeds a threshold value.

12. The power cable system according to claim 1, further comprising a pump for regulating the flow of the cooling fluid.

13. A dynamic power generating system, comprising a power cable system according to claim 1, and a dynamic power generator.

14. The dynamic power generating system as claimed in claim 13, wherein the dynamic power generator is either one of a windmill or an offshore windmill.

* * * * *